(12) United States Patent
Takahashi

(10) Patent No.: US 7,570,535 B2
(45) Date of Patent: Aug. 4, 2009

(54) SEMICONDUCTOR INTEGRATED CIRCUIT DEVICE HAVING MEMORY MACROS AND LOGIC CORES ON BOARD

(75) Inventor: Hiroyuki Takahashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 541 days.

(21) Appl. No.: 11/043,165

(22) Filed: Jan. 27, 2005

(65) Prior Publication Data
US 2005/0162960 A1 Jul. 28, 2005

(30) Foreign Application Priority Data
Jan. 28, 2004 (JP) ............................. 2004-019147

(51) Int. Cl.
*G11C 7/00* (2006.01)
(52) U.S. Cl. .............. 365/222; 365/230.05; 365/230.06
(58) Field of Classification Search ............... 365/222, 365/230.05, 230.06
See application file for complete search history.

(56) References Cited

U.S. PATENT DOCUMENTS

| | | | | |
|---|---|---|---|---|
| 5,963,497 A | * | 10/1999 | Holland | 365/222 |
| 6,023,440 A | * | 2/2000 | Kotani et al. | 365/230.03 |
| 6,172,927 B1 | * | 1/2001 | Taylor | 365/219 |
| 6,233,193 B1 | * | 5/2001 | Holland et al. | 365/222 |
| 6,404,670 B2 | * | 6/2002 | Shau | 365/154 |
| 6,563,754 B1 | * | 5/2003 | Lien et al. | 365/222 |
| 6,563,758 B2 | * | 5/2003 | Shau | 365/230.05 |
| 6,967,885 B2 | * | 11/2005 | Barth et al. | 365/222 |

FOREIGN PATENT DOCUMENTS

| | | |
|---|---|---|
| JP | 10-189889 | 7/1998 |
| JP | 2001-101900 | 4/2001 |
| JP | 2001-110197 | 4/2001 |

* cited by examiner

*Primary Examiner*—Tuan T. Nguyen
(74) *Attorney, Agent, or Firm*—McGinn IP Law Group, PLLC

(57) ABSTRACT

A semiconductor integrated circuit device has memory macros and logic cores. The memory macro is composed of a dynamic memory including an access port and a refresh port. The semiconductor integrated circuit device also has a refresh control circuit common for a plurality of the memory macros. The refresh control circuit has a refresh address generation circuit which generates a refresh address for a memory macro having the largest capacity, supplies the refresh address to the memory macro, and supplies given top bits of the refresh address as a refresh address to another memory macro having a smaller capacity.

23 Claims, 5 Drawing Sheets

|  | MEMORY SIZE | REFRESH ADDRESS | NUMBER OF REFRESH WORD LINE/TRIGGER |
| --- | --- | --- | --- |
| MEMORY MACRO 1a | 2Kbits | 11bits | 1 |
| MEMORY MACRO 1b | 16Kbits | 11bits | 8 |
| MEMORY MACRO 1e | 64Kbits | 11bits | 32 |
| MEMORY MACRO 1d | 128Kbits | 11bits | 64 |
| MEMORY MACRO 1c | 256Kbits | 11bits | 128 |

Fig. 8

|  | MEMORY SIZE | REFRESH ADDRESS | NUMBER OF REFRESH WORD LINE/TRIGGER |
| --- | --- | --- | --- |
| MEMORY MACRO 1a | 2Kbits | TOP 11bits | 1 |
| MEMORY MACRO 1b | 16Kbits | TOP 14bits | 1 |
| MEMORY MACRO 1e | 64Kbits | 16bits | 1 |
| MEMORY MACRO 1d | 128Kbits | 16bits | 2 |
| MEMORY MACRO 1c | 256Kbits | 16bits | 4 |

Fig. 9

SEMICONDUCTOR INTEGRATED CIRCUIT DEVICE HAVING MEMORY MACROS AND LOGIC CORES ON BOARD

BACKGROUND OF THE INVENTION

1. Field of the Invention

The present invention relates to a semiconductor integrated circuit device having memory macros and logic cores on board and particularly to System on Chip (SoC) technology.

2. Description of Related Art

The SoC technology which integrates multiple functions in one chip has been widely researched and developed. The SoC has memory macros and logic cores on board, which are normally arranged in a dispersed manner. Use of Static Random Access Memory (SRAM) or Dynamic Random Access Memory (DRAM) for the memory macro is proposed. For example, Japanese Unexamined Patent Publication No. 2001-110197 discloses a semiconductor memory device composed of a SRAM macro. Further, Japanese Unexamined Patent Publications No. 10-189889 and 2001-101900 disclose a DRAM macro.

SRAM is normally composed of either four or six transistors per cell. A high resistance load cell has four transistors consisting of two selection transistors connected to a bit line pair and two transistors with a cross-connected gate and drain. An active device load has six transistors. On the other hand, DRAM is composed of one transistor and one capacitor.

Thus, DRAM is preferable than SRAM in terms of a chip area, power consumption, and costs. However, since DRAM requires refresh cycles and bit line precharge, SRAM is generally used for memory macros.

Though SoC generally uses SRAM as a memory macro for the above reason, reduction of a chip area is strongly required with an increase in the circuit size of SoC. If a memory macro is made of SRAM, for example, it occupies several tens of Mbit in SoC, and its effect is not negligible. Especially, the percentage of a memory in SoC increases recently and its effect is significant.

Further, with an increase in a circuit size, soft errors such as data breakdown due to alpha radiation and cosmic radiation grow into a serious problem.

The present invention has recognized that merely replacing SRAM with DRAM results in failure to read data during a refresh cycle. Further, though use of DRAM simplifies the configuration of a cell, it requires a complicated circuit for refresh control, and placing a refresh control circuit for each of dispersed memories lowers the effectiveness of chip area reduction.

SUMMARY OF THE INVENTION

According to one aspect of the present invention, there is provided a semiconductor integrated circuit device which includes memory macros composed of a dynamic memory at least including an access port and a refresh port, and logic cores. Since this invention uses a dynamic memory as a memory macro, a chip area decreases compared to the case of using SRAM. Particularly, since the dynamic memory used in this invention includes an access port and a refresh port, it is possible to read data even during a refresh cycle.

It is preferred that the memory macros and the logic cores constitute a plurality of pairs, and the semiconductor integrated circuit further includes a refresh control circuit common for the plurality of memory macros. This suppresses an increase in a circuit size and reduces a chip area.

BRIEF DESCRIPTION OF THE DRAWINGS

The above and other objects, advantages and features of the present invention will be more apparent from the following description taken in conjunction with the accompanying drawings, in which:

FIG. 8 is a table to describe a refresh address of the invention; and

FIG. 9 is a table to describe a refresh address of the invention.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
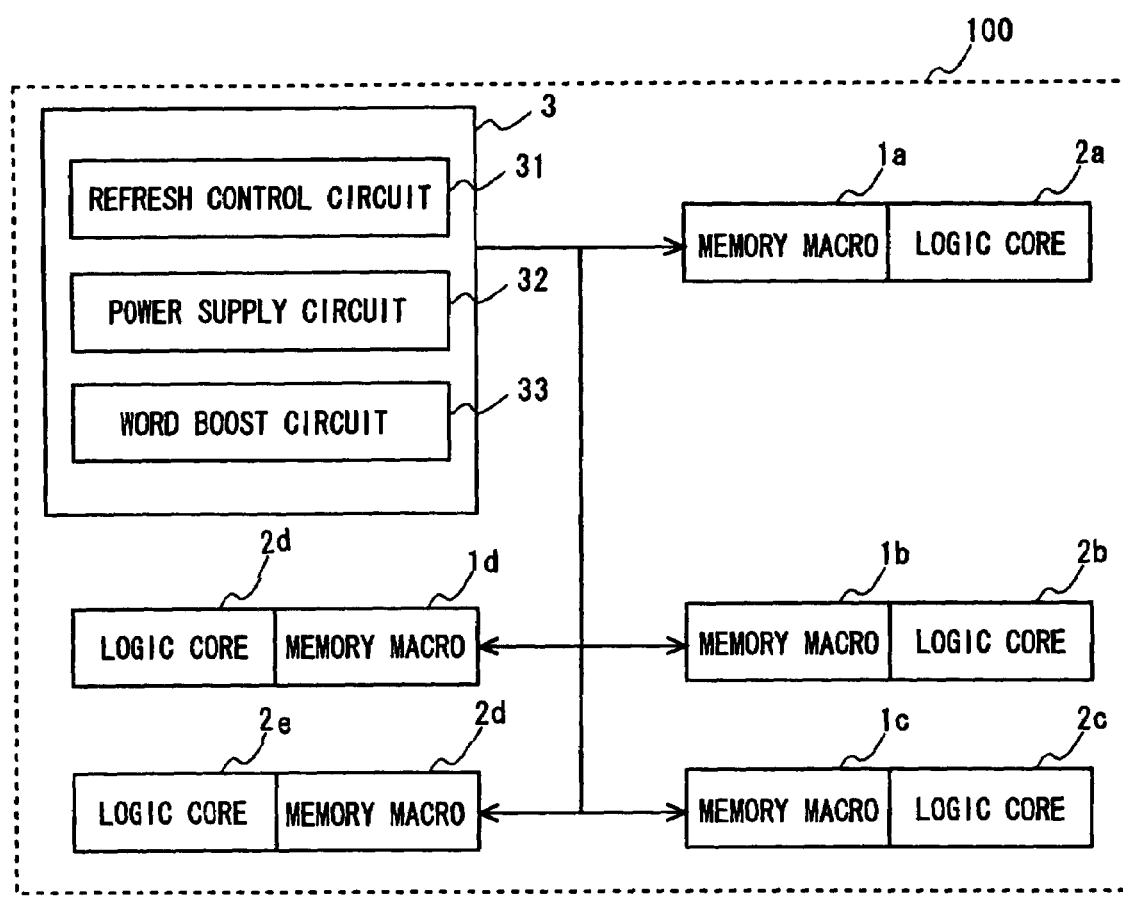
FIG. 1 is a block diagram of a semiconductor integrated circuit device of the invention.

FIG. 1 shows the configuration of a semiconductor integrated circuit device of the invention. The semiconductor integrated circuit device includes a plurality of pairs of memory macros 1 and logic cores 2; specifically, memory macros 1a to 1e and logic cores 2a to 2e. Basically, each of the logic cores 2 uses the memory macro 1. The memory macro 1 is composed not of a SRAM macro but of a DRAM macro. Though all the memory macros 1 are composed of DRAM and SRAM is not included in a preferred embodiment, SRAM may be included partly. The logic core 2 is connected to a data/control bus (not shown) disposed on the chip so as to allow data access to the outside world through the bus. The memory macros 1, the logic cores 2, and an auxiliary circuit 3 that is described later are formed in one chip 100 by the SoC technology.

This embodiment uses a dynamic memory (DRAM) including an access port and a refresh port as the memory macro 1. The configuration of the memory macro 1 is detailed later. The logic cores 2a to 2e include a central processor unit (CPU), an arithmetic circuit, an imaging circuit, and so on.

The semiconductor integrated circuit device includes the auxiliary circuit 3 which is commonly used for the plurality of pairs of memory macros 1 and logic cores 2. The auxiliary circuit 3 has a refresh control circuit 31, a power supply circuit 32, and a word boost circuit 33.

The refresh control circuit 31 controls refresh of memory cells in the memory macros 1, which is detailed later. The refresh control circuit 31 generates a refresh start trigger signal and a refresh address, for example, and outputs them to the memory macros 1.

The power supply circuit 32 supplies power to the circuits in the SoC, such as the memory macros 1a to 1e and the logic cores 2a to 2e. The word boost circuit 33 boosts a word line voltage.

Figure 2:
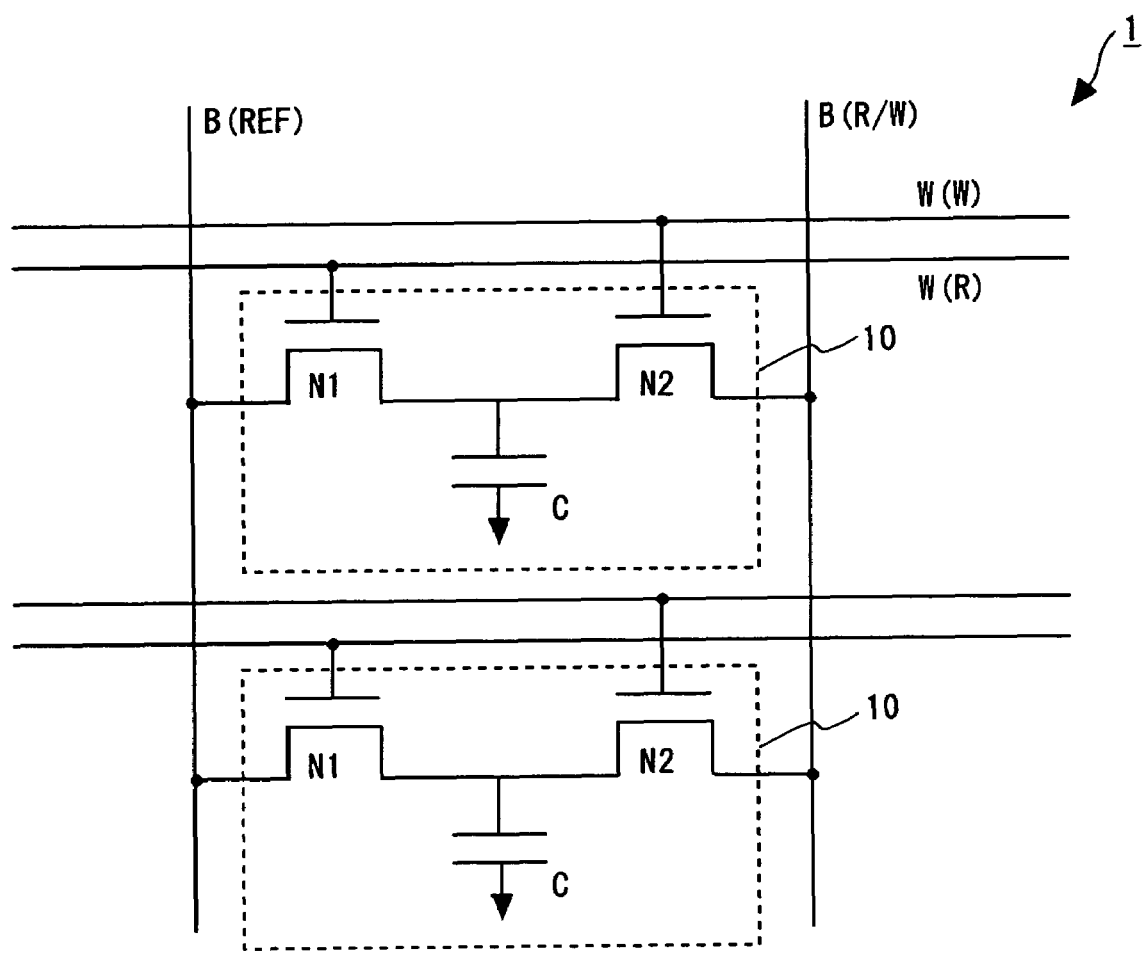
FIG. 2 is a diagram showing an example of the circuit configuration of a memory macro of the invention.

FIG. 2 shows a specific circuit configuration of the memory macro 1. FIG. 2 illustrates two memory cells 10. The memory cell 10 has two cell transistors N1 and N2 that are connected in series between a refresh bit line B (REF) and a read/write bit line B (R/W). A storage node of a capacitor device C for storing data is connected to a connection point of the first cell transistor N1 and the second cell transistor N2. The gate terminal of the first cell transistor N1 is connected to a read word line W (R). The gate terminal of the second cell transistor N2 is connected to a write word line W (W).

A port connecting the first cell transistor N1 to the refresh bit line B (REF) is called a refresh port. A port connecting the second cell transistor N2 to the read/write bit line B (R/W) is called an access port. This invention is not limited to the application to the circuit configuration of FIG. 2. For example, an access port may be a dedicated read port connected to a dedicated read bit line or a dedicated write port connected to a dedicated write bit line.

The memory macro 1 having the configuration of FIG. 2 can read or write data even during a refresh cycle. Thus, no access delay occurs due to refresh. Though the circuit with the configuration of FIG. 2 is called a dual port circuit in some cases, the memory macro of this invention includes not only a circuit having two ports but also a circuit having three or more ports. For example, SRAM having N number of multiple ports can be replaced by DRAM having N+1 number of ports.

Figure 3:
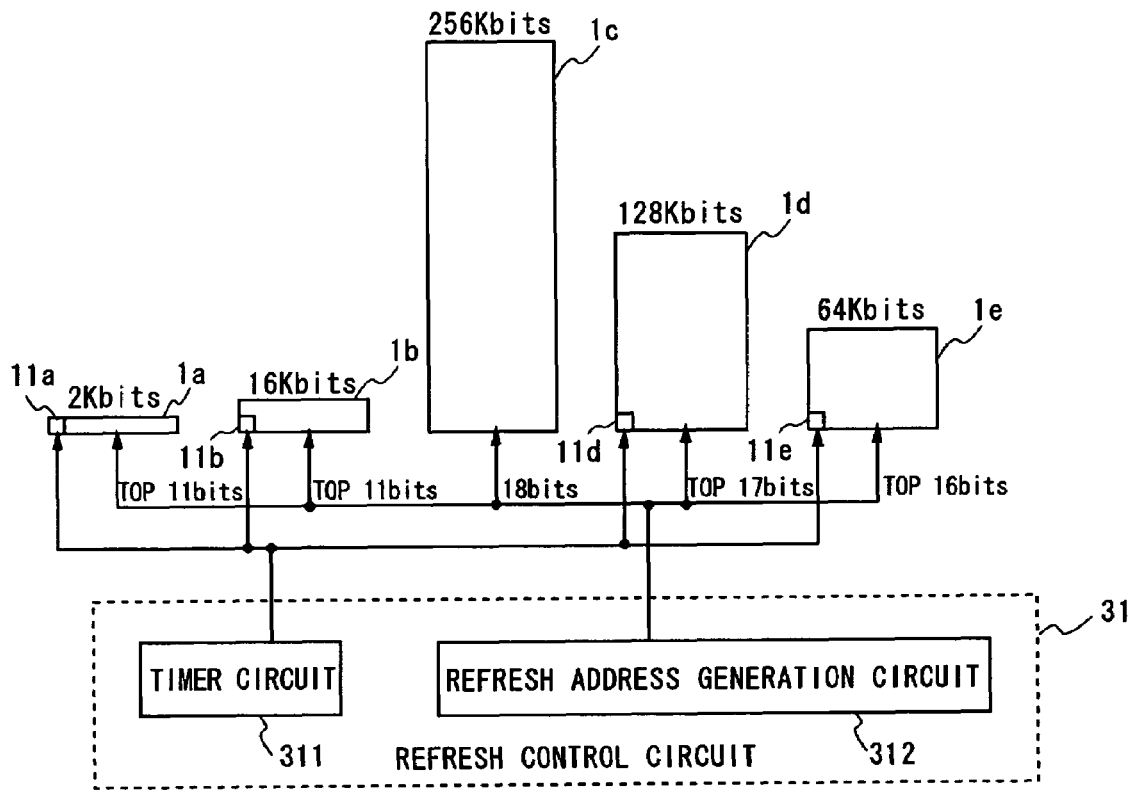
FIG. 3 is a block diagram to describe a refresh operation of the invention.

The operation of the refresh control circuit 31 in the semiconductor integrated circuit device of the invention is described hereinafter. FIG. 3 is a diagram to describe the operation of the refresh control circuit 31.

The SoC normally includes a plurality of memory macros 1a to 1e having different capacities. FIG. 3 illustrates by example five kinds of memory macros 1a to 1e including 2-Kbit, 16-Kbit, 256-Kbit, 128-Kbit, and 64-Kbit memory cells. It is not preferred to place a circuit that supplies a refresh start trigger signal and a refresh address signal to the memory macro for each of the memory macros 1a to 1e since it increases a circuit size. Thus, the present invention places the refresh control circuit 31 which is common for the plurality of memory macros 1a to 1e having different capacities, thereby suppressing an increase in the circuit size to achieve chip area reduction.

The refresh control circuit 31 has a timer circuit 311 and a refresh address generation circuit 312. The timer circuit 311 generates a refresh start trigger signal that triggers the start of a refresh operation. The refresh address generation circuit 312 generates a refresh address that selects a memory cell to refresh.

Figure 4:
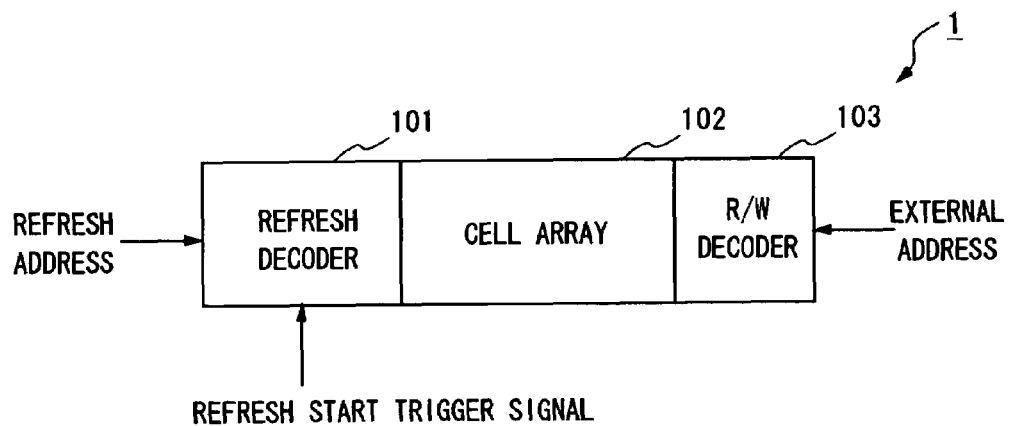
FIG. 4 is a block diagram of a memory macro of the invention.

The memory macros 1a, 1b, 1d, and 1e, which are all memory macros other than the memory macro 1c with the largest circuit size, have frequency divider circuits 11a, 11b, 11d, and 11e, respectively. FIG. 4 shows a specific configuration example of the memory macro 1. The memory macro 1 includes a refresh decoder 101, a cell array 102, and an R/W decoder 103. The refresh decoder 101 receives a refresh start trigger signal from the timer circuit 311 and a refresh address from the refresh address generation circuit 312. The refresh decoder 101 starts refresh of a memory cell selected from the cell array 102 by the refresh address at a timing determined according to the refresh start trigger signal. The R/W decoder 103 receives an external address and reads or writes data from or to a memory cell selected by the external address.

Figure 5:
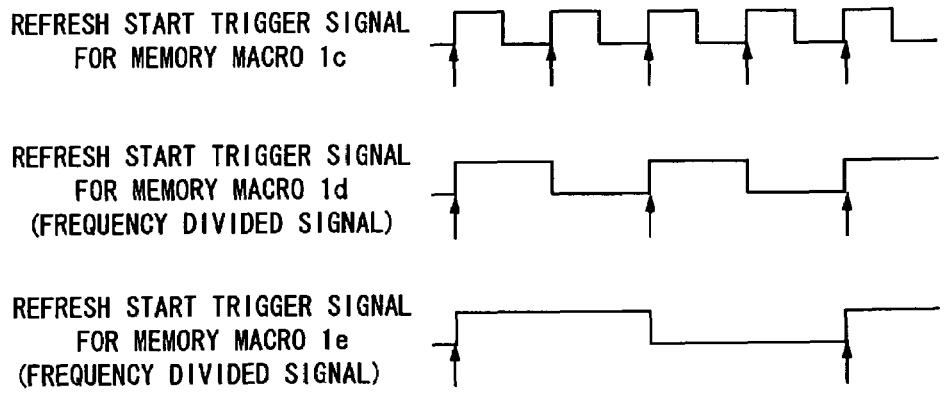
FIG. 5 is a timing chart showing an example of data of a refresh address of the invention.

Referring then to FIG. 5, generation of the refresh start trigger signal is explained below. FIG. 5 illustrates examples of the refresh start trigger signals for the memory macros 1c, 1d, and 1e of FIG. 3.

The timer circuit 311 of this invention generates a refresh start trigger signal for the memory macro 1c having the largest circuit size. This signal is referred to hereinafter as a reference trigger signal. The reference trigger signal is input not only to the memory macro 1c but also to the memory macros 1a, 1b, 1d, and 1e.

The memory macros 1a, 1b, 1d, and 1e have the frequency divider circuits 11a, 11b, 11d, and 11e, respectively. The frequency divider circuits 11a, 11b, 11d, and 11e are formed in the refresh decoder 101 shown in FIG. 4. Each of the frequency divider circuits 11a, 11b, 11d, and 11e receives the reference trigger signal generated in the timer circuit 311 and divides the frequency of the signal in accordance with the capacity of the memory macros 1a, 1b, 1d, and 1e to generate a refresh start trigger signal.

For example, the frequency divider circuit 11d of the 128-Kbit memory macro 1d divides the frequency so that the cycle becomes twice (first power of two) the length of the reference trigger signal. The frequency divider circuit 11e of the 64-Kbit memory macro 1e divides the frequency so that the cycle becomes 4 times (second power of two) the length of the reference trigger signal. Similarly, the frequency divider circuit 11a, 128 times (seventh power of two), and the frequency divider circuit 11b, 16 times (fourth power of two).

It is possible to generate a refresh start trigger signal for each of the memory macros 1 in the refresh control circuit 31 and then supplies the signal to each memory macro 1. However, this configuration requires the same number of lines as the memory macros 1, which is six in this case, to be connected from the refresh control circuit 31, causing a larger chip area. Thus, this embodiment generates the refresh start trigger signal only for the memory macro 1c with the largest capacity in the refresh control circuit 31 and supplies this signal, a reference trigger signal, to all the memory macros 1. Then, the frequency divider circuit 11 in each of the memory macros except for the memory macro 1c generates a refresh start trigger signal specific for each memory macro. The number of lines required is thereby basically one, allowing reduction of the chip area.

Figure 6:
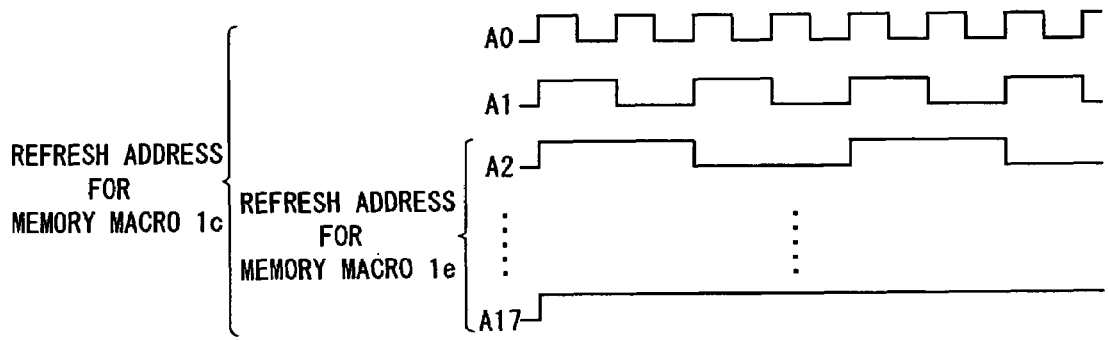
FIG. 6 is a timing chart showing an example of a refresh start trigger signal of the invention.

Referring then to FIG. 6, refresh addresses generated in the refresh address generation circuit 312 of the refresh control circuit 31 is described hereinafter. The refresh address is made of a combination of 18 bits of A0 to A17. A0 is a data string repeating "1" and "0" in a given cycle. The cycle of A1 is twice the length of the cycle of A0. The cycle of A2 is 4 times the length of the cycle of A0. The cycle of A3 is 8 times the length of the cycle of A0. The cycle of A4 is 16 times the length of the cycle of A0. In this way, the cycle increases twice by twice from A0 to A17. With such a data string, combining A0 to A17 generates an address of eighteenth power of two or about 262K.

Since the memory macro 1c with the largest capacity in the memory macros 1 of this example has 256-Kbit memory cells as shown in FIG. 3, it is possible to generate an address for all the memory cells with a combination of 18 bits from A0 to A17 shown in FIG. 6. This embodiment generates a 18-bit address from A0 to A17 in the refresh address generation circuit 312 and supplies the address as a refresh address to the 256-Kbit memory macro 1c.

On the other hand, a refresh address of as many as 18 bits is not necessary for the memory macros 1a, 1b, 1d, and 1e having a smaller capacity than the memory macro 1c since the number of memory cells is small. Thus, in this example, top 17 bits of data A1 to A17 of 18 bits from A0 to A17 supplied as a refresh address to the 256-Kbit memory macro 1c is supplied to the 128-Kbit memory macro 1d. Similarly, top 16 bits of data A2 to A17 is supplied to the 64-Kbit memory macro 1e, top 14 bits of A4 to A17 is supplied to the 16-Kbit memory macro 1b, and top 11 bits of A7 to A17 is supplied to the 2-Kbit memory macro 1a, each as a refresh address.

For the memory macros 1a, 1b, 1d, and 1e with a smaller capacity than the memory macro 1c, bottom bits, not top bits, of 18 bits of data from A0 to A17 may be used to select the memory cells in the memory macros 1a, 1b, 1d, and 1e. However, use of bottom bits to generate a refresh address results in a shorter cycle, leading to unnecessarily frequent refresh operation. Frequent refresh operation causes excessive current consumption, and the frequency of the refresh operation is preferably minimum. For this reason, this embodiment uses the number of bits from top necessary for selecting all the memory cells of the refresh address for the memory macro with the largest capacity as a refresh address for memory macros with a smaller capacity.

Figure 7:
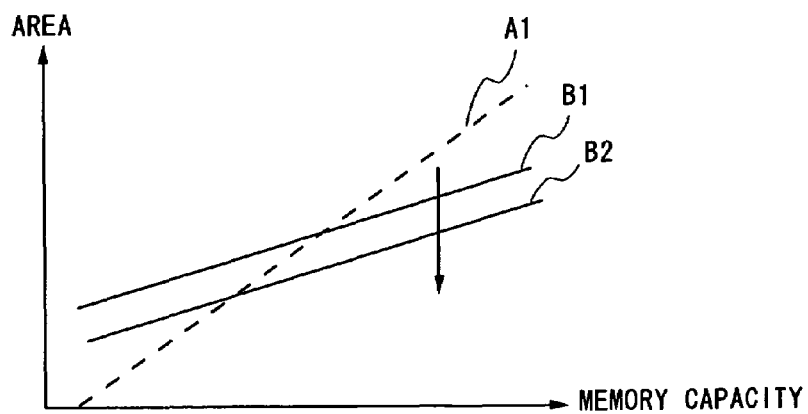
FIG. 7 is a conceptual diagram to describe the effect of the invention.

Referring now to FIG. 7, the chip area reduction effect of the present invention is described hereinafter. The dashed line A1 indicates the case where a memory macro is composed of SRAM. The full line B1 indicates the case where a memory macro is composed of a circuit as shown in FIG. 2 in which an auxiliary circuit such as a refresh circuit is not used in common. The full line B2 indicates the case where a memory macro is composed of a circuit as shown in FIG. 2 and an auxiliary circuit such as a refresh circuit is used in common. If a memory capacity is relatively small, use of the circuit of FIG. 2 to form a memory macro causes the chip area to increase rather than decrease since it requires a refresh circuit or the like as an extra element. However, with an increase in a memory capacity, the chip area reduction effect by the use of the circuit of FIG. 2 to form a memory macro increases accordingly. Further, use of an auxiliary circuit such as a refresh circuit in common enhances the chip area reduction effect.

Second Embodiment

A semiconductor integrated circuit device of a second embodiment of the invention is substantially the same as the semiconductor integrated circuit device of the first embodiment except for the refresh operation.

As shown in FIG. 8, the refresh address generation circuit 312 of this embodiment generates a refresh address of 11 bits. The refresh address generation circuit 312 then supplies the generated refresh address to the memory macros 1a to 1e.

Though the 11-bit refresh address can select all the memory cells for the memory macro 1a with a capacity of 2 Kbits, it can select only part of the memory cells for the memory macros 1b to 1e with a larger capacity.

Thus, in this embodiment, the refresh decoder 101 of FIG. 4 is configured so as to select a plurality of word lines at a time to refresh for the memory macros 1b to 1e. This simplifies the configuration of the refresh decoder 101 and reduces the capacity. Specifically, as shown in FIG. 8, the refresh decoder 101 selects 8 word lines at a time for the 16-Kbit memory macro 1b, 32 word lines for the 64-Kbit memory macro 1e, 64 word lines for the 128-Kbit memory macro 1d, and 128 word lines for the 256-Kbit memory macro 1c to refresh cells.

This embodiment eliminates the need for frequency divider circuits and reduces the number of lines for transmitting refresh addresses.

It is preferred to limit the number of word lines to be selected at a time within a given number since selecting too many lines results in an excessive current flow to cause noise.

Third Embodiment

A semiconductor integrated circuit device of a third embodiment of the invention is substantially the same as the semiconductor integrated circuit device of the first embodiment except for the refresh operation.

The refresh address generation circuit 312 of this embodiment generates a refresh address of 16 bits. The refresh address generation circuit 312 then supplies the same refresh address of 16 bits to the memory macros 1c and 1e.

On the other hand, the refresh address generation circuit 312 supplies top 11 bits of the 16 bits as a refresh address to the memory macro 1a, and supplies top 14 bits as a refresh address to the memory macro 1b.

Further, as shown in FIG. 9, this embodiment selects two word lines at a time for the 128-Kbit memory macro 1d, and four word lines at a time for the 256-Kbit memory macro 1c to refresh cells.

The configuration of this embodiment has the features of both first and second embodiments for the generation of refresh addresses. This embodiment also eliminates the need for part of frequency divider circuits and reduces the number of lines for transmitting refresh addresses.

It is apparent that the present invention is not limited to the above embodiment that may be modified and changed without departing from the scope and spirit of the invention.

What is claimed is:

1. A semiconductor integrated circuit device, comprising:
    at least two memory macros having different memory capacities and each comprising a dynamic memory including at least an access port and a refresh port; and
    logic cores.

2. The semiconductor integrated circuit device of claim 1, wherein:
    the at least two memory macros and the logic cores constitute a plurality of pairs, and
    the semiconductor integrated circuit further comprises a refresh control circuit common for the plurality of pairs.

3. The semiconductor integrated circuit device of claim 2, wherein:
    the at least two memory macros comprise a first memory macro and a second memory macro, the second memory macro having a smaller memory capacity than the first memory macro, and
    the refresh control circuit comprises a refresh address generation circuit generating a refresh address for the first memory macro, supplying the refresh address to the first memory macro, and supplying a portion only of bits included in the refresh address as a refresh address to the second memory macro having the smaller capacity.

4. The semiconductor integrated circuit device of claim 2, wherein
    the refresh control circuit comprises a refresh address generation circuit generating a refresh address for a first memory macro of said at least two memory macros, supplying the refresh address to the first memory macro, and supplying only given top bits of the refresh address as a refresh address to a second memory macro of said at least two memory macros having a smaller capacity than the first memory macro.

5. The semiconductor integrated circuit device of claim 2, wherein:
   a second memo macro of said at least two memory macros having a smaller capacity than a first memory macro of said at least two memory macros comprises a frequency divider circuit,
   the refresh control circuit comprises a timer circuit generating a refresh start trigger signal that triggers a start of a refresh operation for the first memory macro and supplying the refresh start trigger signal to the first memory macro and the frequency divider circuit of the second memory macro, and
   the frequency divider circuit generates a refresh start trigger signal for the second memory macro by dividing a frequency of the refresh start trigger signal supplied from the timer circuit and supplies the generated refresh start trigger signal to the second memory macro.

6. A semiconductor integrated circuit device of claim 2, wherein:
   a second memory macro of said at least two memory macros having a smaller capacity than a first memory macro of said at least two memory macros comprises a frequency divider circuit,
   the refresh control circuit comprises a refresh address generation circuit generating a refresh address for the first memory macro, supplying the refresh address to the first memory macro, and supplying part of bits included in the refresh address as a refresh address to the second memory macro having the smaller capacity than the first memory macro and a timer circuit generating a refresh start trigger signal that triggers a start of a refresh operation for the first memory macro and supplying the refresh start trigger signal to the first memory macro and the frequency divider circuit of the second memory macro, and
   the frequency divider circuit generates a refresh start trigger signal for the second memory macro by dividing a frequency of the refresh start trigger signal supplied from the timer circuit and supplies the generated refresh start trigger signal to the second memory macro.

7. A semiconductor integrated circuit device of claim 2, wherein:
   a second memory macro of said at least two memory macros having a smaller capacity than a first memory macro of said at least two memory macros comprises a frequency divider circuit, the refresh control circuit comprising:
      a refresh address generation circuit generating a refresh address for the first memory macro, supplying the refresh address to the first memory macro, and supplying given top bits of the refresh address as a refresh address to the second memory macro having the smaller capacity than the first memory macro; and
      a timer circuit generating a refresh start trigger signal that triggers a start of a refresh operation for the first memory macro and supplying the refresh start triggers concurrently to the first memory macro and the frequency divider circuit of the second memory macro; and
   the frequency divider circuit generates a refresh start trigger signal for the second memory macro by dividing a frequency of the refresh start trigger signal supplied from the timer circuit and supplies the generated refresh start trigger signal to the second memory macro.

8. A semiconductor integrated circuit device of claim 2, wherein:
   the at least two memory macros comprise at least a first memory macro and a second memory macro, said second memory macro having a smaller capacity than a capacity of the first memory macro,
   the refresh control circuit comprises a refresh address generation circuit generating a refresh address for the second memory macro and supplying the refresh address to the first memory macro and the second memory macro, and
   the first memory macro comprises a refresh decoder generating a refresh address selecting a plurality of word lines according to the refresh address supplied from the refresh address generation circuit.

9. A semiconductor integrated circuit device of claim 2, wherein:
   the at least two memory macros comprise at least a first memory macro, a second memory macro having a smaller capacity than a capacity of the first memory macro, and a third memory macro having a smaller capacity than the capacity of the second memory macro,
   the refresh control circuit comprises a refresh address generation circuit generating a refresh address for the second memory macro, supplying the refresh address to the first memory macro and the second memory macro, and supplying part of bits of the refresh address to the third memory macro, and
   the first memory macro comprises a refresh decoder generating a refresh address selecting a plurality of word lines according to the refresh address supplied from the refresh address generation circuit.

10. A semiconductor integrated circuit device of claim 2, wherein:
    the at least two memory macros comprise at least a first memory macro, a second memory macro having a smaller capacity than a capacity of the first memory macro, and a third memory macro having a smaller capacity than the capacity of the second memory macro,
    the refresh control circuit comprises a refresh address generation circuit generating a refresh address for the second memory macro, supplying the refresh address to the first memory macro and the second memory macro, and supplying given top bits of the refresh address to the third memory macro, and
    the first memory macro comprises a refresh decoder generating a refresh address selecting a plurality of word lines according to the refresh address supplied from the refresh address generation circuit.

11. A semiconductor integrated circuit device, comprising:
    a plurality of memory arrays comprising:
       a plurality of memory macros, at least two memory macros having different capacities and each including an access port and a refresh port; and
       logic cores, each logic core being paired with a single memory macro; and
    a refresh control circuit common for each memory array.

12. A semiconductor integrated circuit device of claim 11, wherein
    the memory macros and the logic cores constitute a plurality of pairs; and
    the semiconductor integrated circuit further comprises a power supply circuit common for the plurality of pairs of memory macros and logic cores.

13. A semiconductor integrated circuit device of claim 11, wherein
    all memory macros included in the semiconductor integrated circuit device are comprised of a dynamic memory.

14. A semiconductor integrated circuit device of claim 13, wherein:
the memory macros and the logic cores constitute a plurality of pairs, and
the semiconductor integrated circuit further comprises a power supply circuit common for the plurality of pairs of memory macros and logic cores.

15. A semiconductor integrated circuit device of claim 13, wherein
all memory macros included in the semiconductor integrated circuit device are comprised of a dynamic memory at least including an access port and a refresh port.

16. A semiconductor integrated circuit device of claim 11, wherein the refresh control circuit comprises a refresh address generation circuit generating a refresh address for a first memory macro of each memory array, supplying the refresh address to the first memory macro, and supplying part of bits included in the refresh address as a refresh address to a second memory macro of said each memory array having a smaller capacity than the first memory macro.

17. A semiconductor integrated circuit device, comprising:
a plurality of memory arrays, each memory array comprising:
a plurality of memory macros having different capacities and at least including a memory cell array, a read/write decoder, and a refresh decoder; and
a plurality of logic cores, each logic core being paired with a single memory macro.

18. A semiconductor integrated circuit device of claim 17, further comprising:
a refresh control circuit common for each memory array, each refresh control circuit providing refresh addresses and refresh trigger signals to the refresh decoders.

19. A semiconductor integrated circuit device of claim 17, wherein the memory cell array comprises dynamic memory.

20. A semiconductor integrated circuit device, comprising:
a first memory macro and a second memory macro, each of said first and second memory macros including a plurality of dynamic memory cells and logic core, said first memory macro having a memory capacity larger than a memory capacity of said second memory macro; and
a refresh control circuit coupled in common to said first and second memory macros for performing a refresh operation to said first and second memory macros,
wherein said refresh control circuit contains a refresh address generator generating a refresh address to apply said refresh address to said first and second memory macros, and
wherein said first memory macro operates said refresh operation based on said refresh address and said second memory macro operates said refresh operation based on a portion of said refresh address.

21. The device as claimed in claim 20, wherein an entirety of said refresh address is supplied to said first memory macro and only a portion of said refresh address is supplied to said second memory macro.

22. The device as claimed in claim 20, wherein said logic core of said first memory core includes a first refresh decoder receiving a refresh address signal and a refresh start trigger signal, said logic core of said second memory core includes a second refresh decoder receiving said refresh address signal and a frequency-divided version of said refresh start trigger signal.

23. The device as claimed in claim 20, wherein said first and second memory macros include an access port and a refresh port.

* * * * *